United States Patent [19]

Ohta et al.

[11] Patent Number: 4,661,830
[45] Date of Patent: Apr. 28, 1987

[54] SOLID STATE IMAGER

[75] Inventors: Yoshio Ohta, Amagasaki; Takao Chikamura, Tsuzuki; Yutaka Miyata, Hirakata; Kohsaku Yano, Higashiosaka; Shinji Fujiwara, Minoo, all of Japan

[73] Assignee: Matsushita Electric Industrial Co., Ltd., Osaka, Japan

[21] Appl. No.: 626,730

[22] Filed: Jul. 2, 1984

[30] Foreign Application Priority Data

Jul. 6, 1983 [JP] Japan ................................ 58-122802
Jul. 6, 1983 [JP] Japan ................................ 58-122803

[51] Int. Cl.[4] ...................... H01L 27/14; H01L 29/78; H01L 31/00
[52] U.S. Cl. ........................................ 357/30; 357/24; 358/213
[58] Field of Search ............. 357/30, 24 LR; 307/311; 358/213, 241, 165

[56] References Cited

U.S. PATENT DOCUMENTS 4,271,420  6/1981  Chikamura et al. ................... 357/30

FOREIGN PATENT DOCUMENTS 56-72582   6/1981  Japan .
0102170    8/1981  Japan ................................. 358/213
56-140773  11/1981 Japan .

Primary Examiner—James W. Davie
Assistant Examiner—Georgia Y. Epps
Attorney, Agent, or Firm—Spencer & Frank

[57] ABSTRACT

This invention discloses a high efficiency solid state imager combining a semiconductor substrate having a charge transfer function and a photoelectric conversion film, wherein a high frequency transfer pulse having a frequency higher than that of a vertical transfer pulse is applied for a prescribed time during the vertical blanking period; voltages with different values are applied to a transparent electrode provided on the above-mentioned photoelectric conversion film in the first and second period of the period with the presence of the above-mentioned high frequency transfer pulse; and a voltage differing with each field is applied to the above-mentioned transparent electrode during the vertical blanking period, whereby blooming, highlight lag and flicker due to an intense light are considerably suppressed.

14 Claims, 15 Drawing Figures

SOLID STATE IMAGER

BACKGROUND OF THE INVENTION

1. Field of the Invention

This invention relates to a solid state imager, and more particularly to a solid state imager of a sensor type wherein a photo-electric converting film is overlaid on an LSI scanning surface or circuit. The objective of the invention is to solve important problems of the imager, blooming, lag in the highlight condition and flicker.

2. Description of the Prior Art

A solid state imager of the sensor type has been proposed, in which a solid state imager (hereinafter referred to as Si alone type) combined with a photosensitive element such as a photodiode and an electric charge transfer element such as an MOS transistor and CCD (charge-coupled device) is used as a scanning circuit and a photoconductive film is overlaid on the scanning circuit in a three-dimensional fashion in order to improve the sensitivity. A large problem of such a sensor type is the so-called highlight lag, i.e., when the light from an object is intense, the lag component is emphasized. Another problem is the occurrence of a blooming phenomenon as will be discussed. Causes for such problems and countermeasures that have been proposed are explained below.

The Si-alone type includes a well-known CCD of interline type, CCD of frame transfer type, MOS matrix type and CPD type where MOS is used as the region of imaging area and CCD is used as the horizontal line. Here, for clarification, explanation will be made of a case where the CCD of interline type is used as the scanning circuit of a sensor type imager.

FIG. 1 shows a planar view of a CCD of interline type. Reference numeral 11 denotes a region corresponding to the imaging area and 12 denotes a source terminal which operates as a photodiode in the case of Si-alone element. Signal charges generated in this region are transferred to a vertical line 14 through a gate 13, further transferred in the direction of an arrow 15 and read into a horizontal output line 16. It is well known that the signal charges are then transferred to the direction of an arrow 17 and generate an output signal.

In the case of such a sensor type, since the above-mentioned photodiode does not have a function of photoelectric conversion a new photoelectric conversion film is provided on the region through a metal electrode, and the photodiode operates only as the source terminal for the above-mentioned gate electrode. The three-dimensional arrangement of the photoelectric conversion film on the source terminal makes a photoelectric conversion region corresponding to one picture-element which has a larger planar area than the area of source terminal as shown by oblique lines in the figure. For clarification, the region of photoelectric conversion corresponding to one picture-element is shown by dotted lines 18 in FIG. 1.

As apparent from FIG. 1, in the sensor type, since the area contributing to photoelectric conversion is much larger than that of an Si-alone element, the sensitivity is improved considerably. However, a saturation-charge quantity increases with the sensitivity. This causes a problem as will be mentioned below. It is well known that, when the vertical line 14 is constituted by a CCD, the signal charges generated by the photoelectric converting film corresponding to one picture-element are transferred to each bit of the CCD. If this signal charge quantity is larger than the maximum charge quantity of one bit of the CCD or is maximum handling charge quantity $Q_{CCD}$, all the signal charges for one field (or for one frame) cannot be always transferred to the CCD side. Thus, excess charges remain on the above-mentioned source terminal. A time corresponding to several fields (one field corresponds to 16.6 ms) is required to finish transferring all the generated charges. Therefore, highlight lag corresponding to this time appears. As is well known, the CCD scanning circuit of interline type reads one picture-element signal from the photoelectric conversion film into the vertical line constituted by the CCD in each vertical blanking period, once for every two fields in the case of interlacing of 2:1 and once for every one field in the case of non-interlacing. Now, if the charge quantity $Q_s$ of the picture-element signal is five times as large as the above-mentioned maximum handling electric charge quantity $Q_{CCD}$, highlight lag corresponding to a time for 10 fields (about 166 ms) appears in the case of interlaced operation. The charge quantity $Q_s$ further increases, as the brightness of a radiant body of an object becomes greater. Increases in the interval of the highlight lag and in its quantity cause a phenomenon of the so-called highlight lag.

Besides this highlight lag, if the signal charge quantity is larger than $Q_{CCD}$, all the charges cannot always be transferred into the CCD, and an overflow occurs. There has been a problem of the occurrence of an false signal or a blooming component 22 appearing under a highly radiant body 21 such as an electric bulb as shown by the oblique lines on a reproduced image surface in FIG. 2.

In order to reduce the problems of highlight lag and blooming, several proposals have been made. For example, Japanese Patent Application No. 55-43951 (Japanese Patent Kokai No. 56-140773) describes in detail a sweep-out of excess charges by generating high frequency transfer pulses in the vertical blanking period in the series of vertical transfer clock pulses. Although this method can reduce the above-mentioned problems, highlight lag and blooming still appear if the light quantity increases to several tens of the saturation light quantity of an imaging element. The reason for this is due to the fact that excess charges cannot be swept out if the light quantity becomes extremely large. The quantity of swept-out charges depends on the level of depression of the voltage applied to the gate or the depletion layer just under the gate while the excess part of the signal charge on the source terminal is being exhausted to the CCD side.

In order to increase the quantity of swept charges, the gate voltage should be increased. This requires a voltage which by far exceeds the breakdown voltage of the LSI, leading to a breakdown of the imaging element.

Japanese Patent Application No. 54-149375 (Japanese Patent Kokai No. 56-72582) discloses a method for solving the above problem, in which a pulse voltage is applied to a transparent electrode provided on the photoconductive film at every vertical blanking period.

However, although this method can improve the above-mentioned problem, blooming and highlight lag still appear when the light quantity of an object reaches a value about 500 times as large as the saturation light quantity. For clarification, only the main reason will be described here; however, a more detailed explanation will be mentioned later in the detailed description of this invention.

FIG. 3 is a planar diagram of the scanning circuit used in the sensor type, showing two-bit segments in the vertical direction.

A region 30 denoted by dots indicates a CCD channel region, and an arrow 31 shows the transfer direction of electric charge.

This CCD is a CCD of two-phase driving. $T_1$ and $T_2$ are CCD transfer electrodes, which serve also as gate electrodes (hereinafter called read-in gate) for reading signal charges obtained at the source terminal 32 into CCD channels through each gate region $g_1$ (denoted by oblique lines) and $g_2$ (denoted by crosslatching).

As is well known, an impurity layer is provided just under the read-in gate by the method of ion implantation, etc., to determine the threshold voltage $V_P$ of this gate.

In the semiconductor process, transfer electrodes $T_1$ and $T_2$ cannot be formed simultaneously. The reason is due to the fact that the electrodes $T_1$ and $T_2$ should have an overlapping part (denoted by OA in FIG. 3) in order to guarantee the transfer efficiency of CCD. Now, if the electrode $T_1$ is formed before the electrode $T_2$, the threshold voltage $V_P$ of the gate regions $g_1$ and $g_2$ underlying the electrodes $T_1$ and $T_2$, respectively, differ from each other.

We denote $V_P$ of the gates $g_1$ and $g_2$ as $V_{P1}$ and $V_{P2}$, respectively. The sweep-out quantity of excess charges differs with the voltage difference between $V_{P1}$ and $V_{P2}$. Now, if we assume that the gate $g_1$ is a gate electrode for reading the signal charges in the period of odd fields while the gate $g_2$ is a gate electrode corresponding to even fields, the level of saturation output signal differs with fields, which causes flicker.

Furthermore, if the light quantity is extremely large, the excess charges to be swept out increase in quantity. When the voltage at ITO terminals is controlled by the conventional method to sweep out such a large quantity of excess charges, the signal charge read through a gate with a larger $V_P$, that could reach a level of saturation output signal, is cut down. This causes a decrease in the dynamic range of the imaging element. In order to deal with the problems of flicker and reduction of dynamic range by the conventional method, the quantity of excess charges to be swept out should be limited.

This in turn induces the afore-mentioned problems of highlight lag and blooming, etc., which appear in the case of intense light.

SUMMARY OF THE INVENTION

This invention aims to eliminate the highlight lag and the blooming which appear under intense light, suppress flicker by means of a simple constitution and thereby obtain an image with high quality. Furthermore, this invention aims to remove the afore-mentioned defects of the prior art and eliminate the highlight lag and the blooming with use of a voltage below the breakdown voltage of the imaging element.

The present invention is different from the prior art method for sweeping out excess charges. Use is made of the merit of the solid state imager of a sensor type where a transparent electrode is provided on a photoelectric conversion film. Flicker is eliminated in the following manner. In the vertical blanking period of the high frequency transfer pulse, special pulses with a voltage differing in first and second intervals are applied to the transparent electrode. A voltage applied to the above mentioned transparent electrode is made variable for each field in the vertical blanking period. Furthermore, the invention ensures the elimination of highlight lag and blooming.

DESCRIPTION OF THE PREFERRED EMBODIMENTS

Embodiment 1

Figure 4:
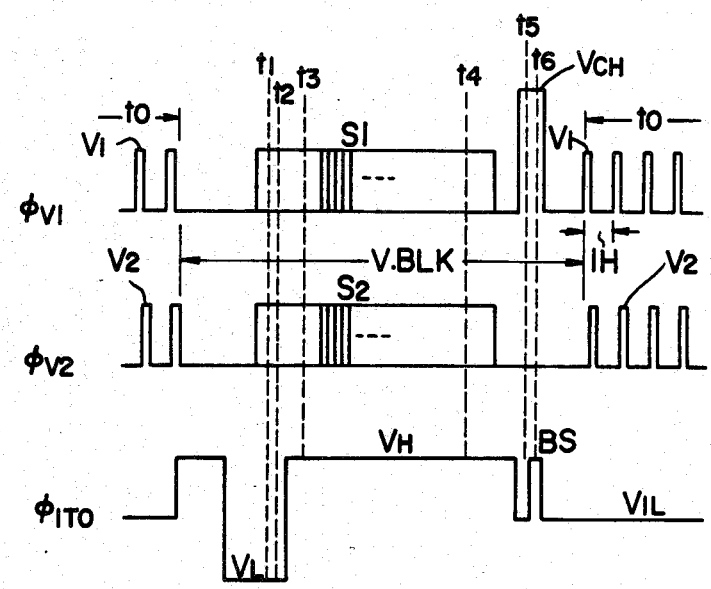

FIG. 4 shows timing charts for the main sections of the driving method of a first embodiment of this invention.

$\phi_{V1}$ and $\phi_{V2}$ are transfer clocks of a CCD of a two-phase driving system which constitutes the vertical line. The period $t_0$ corresponds to a light signal storage period. Stored signal charge is read into the CCD side by a read-in pulse $V_{CH}$ for a picture element and further transferred in the vertical direction by two-phase transfer pulses $V_1$ and $V_2$ having different phases. Pulse series $S_1$ and $S_2$ appearing in the vertical blanking period V.BLK are high frequency transfer pulses for sweeping out excess electric charges, as mentioned later. These pulses have different phases with respect to each other. $\phi_{ITO}$ denotes a puse which is applied to the transparent electrode on the photoelectric conversion film and is fundamental to this invention.

Figure 5:
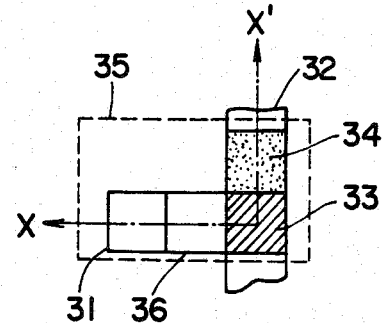
FIG. 5 is a cross-sectional view showing the main structure of the above imager.

FIG. 5 shows an example of a planar view of the region of a sensor type corresponding to one picture element as used in this invention.

Reference numeral 31 denotes a source terminal in which light signal charges are stored. Reference numeral 32 denotes a CCD transfer channel region, which is constituted by a storage region 33 shown by oblique lines and a transfer region 34 shown by dots for one bit. A region 35 shown by dotted lines is a photoelectric conversion film corresponding to one picture-element which is provided on the above source terminal 31 and in electric contact therewith. Reference numeral 36 denotes a gate region which reads the signal charge on the source terminal into the storage region 33 of the CCD. The gate electrode on this gate region serves commonly as a transfer electrode of the CCD. FIG. 6 shows cross-sections along a line X—X' of FIG. 5 in each period $t_0$ to $t_6$ of a clock pulse. In FIG. 5, the transfer electrode of the CCD channel region and the gate electrode for reading are omitted.

Before the detailed explanation of FIG. 6, common parts from the periods $t_0$ to $t_6$ will be explained with reference to the cross-section at $t_0$.

An electrode 41 is a transfer electrode of the CCD where a P-type Si substrate 42 is applied and serves commonly as a read-in gate electrode connected with a clock terminal V. A region C is a CCD (vertical line) region (regions 33, 34 in FIG. 5). Signal charge in an $N^+$-region 31 which is a source terminal is read into the CCD region C of through a gate channel region g just under an $N^-$-impurity region 36. A photoelectric conversion film 35 (see also FIG. 7) forming a diode is overlaid on the above-mentioned source terminal $N^+$-region 31. A transparent-electrode ITO terminal 43 is provided to perform a function of photoelectric conversion by applying a reverse bias voltage to film 35. Signal charges generated in the film 35 depend on the light intensity and are collected into the $N^+$-region 31.

In the P-type Si-substrate 42 of FIGS. 6 the part surrounded with dotted lines 44 schematically indicates the potential level of the depletion layer.

Signal charge, excess electric charges and state of the potential level of depletion layer, etc. in the period of the $t_0$ to $t_6$ will now be explained successively. The part shown by oblique lines in the depletion layer indicates excess charges 45, while the part shown by crosshatching indicates the above-mentioned $Q_{CCD}$ (quantity of normal charges 46 which is smaller than the value stored in the depth d of the bucket in FIG. 6 and reproduced as a correct image).

The potential level of the depletion layer 44 varies with the clock pulses $V_1$ and $V_2$. For clarification, the potential level in a steady state is expressed.

(I) At the time of $t_0$ (FIG. 6a):

Light enters the photoelectric conversion film 35. Signal charges corresponding to the light quantity are stored in the film 35 during this period, giving rise to a potential variation in the region 31. Now, if this film 35 is a heterojunction film such as $ZnSe—Zn_xCd_{1-x}$ known as a commercial name Newvicon, the generated signal charges are electrons. Therefore, when the light intensity is large, excess charges 45 (part denoted by oblique lines in FIG. 6) are stored in addition to the normal charges 46 (crosshatched part).

(II) At the time of $t_1$ (FIG. 6b):

Potential $\phi_{ITO}$ at the terminal 43 on the ITO side is set at a low potential $V_L$ (e.g. 0 to 2 V) as shown in FIG. 4. Then, the potential level of the depletion layer just under the $N^+$-region 31 becomes shallow due to the following reason: Since the photoelectric conversion film 35 has a capacitance, the ITO terminal 43 is capacitively coupled with the $N^+$-region 31. Thus, if the ITO potential $\phi_{ITO}$ becomes low, the potential of the $N^+$-region 31 also decreases.

On the other hand, the level of the depletion layer just under the $N^-$-region 36 is increased from the potential level $\psi_2$ at $t_0$ to $\psi_4$ at $t_1$ by the high frequency transfer pulse series $S_1$ and $S_2$ applied to the electrode 41 during the vertical blanking period V.BLK of transfer clocks $\phi_{V1}$ and $\phi_{V2}$. Furthermore, the potential level just under the $N^+$-region 31 decreases from $\psi_1$ at $t_0$ to $\psi_3$, since the ITO potential drops to $V_L$ (e.g. 8 V) at $t_1$ as mentioned above.

According to a proposed method of the prior art for sweeping out the excess charges, the bottom of the bucket in which the signal charges are stored (the potential level $\psi_1$ just under the above-mentioned $N^+$-region 31) remains deep. In order to sweep out only the excess charges to the CCD side by using the afore-mentioned high frequency transfer pulses $S_1$ and $S_2$ as a gate pulse, the $\psi_2$ level should be dropped to the $\psi_5$ level of the figure at $t_0$. The usual LSI design teaches us that in order to deepen the $\psi_2$ level to such an extent the gate voltage should be made higher than about 30 V, which exceeds by far the breakdown voltage of devices (the maximum breakdown voltage of LSI is usually about 20 V). As a result, the device is destroyed.

According to this invention, even if the potential level just under the gate is shallow as shown by $\psi_4$, the bottom of the bucket for storing the above-mentioned signal charges becomes as shallow as $\psi_3$ (from $\psi_1$ at $t_0$) if the voltage on the ITO side is reduced from $V_H$ (about 10 V) to $V_L$ ($<V_{1L}$). Thus, only the excess charges can be easily transferred to the CCD side, as shown by an arrow in FIG. 6b.

Figure 6A:
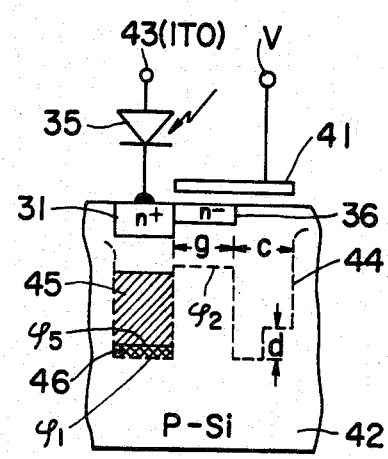
FIGS. 6a to 6g are constitution diagrams showing the operation state at each timing of the above solid state imager.
Figure 6B:
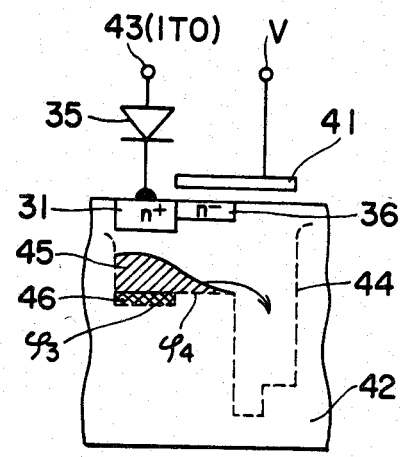
Figure 6C:
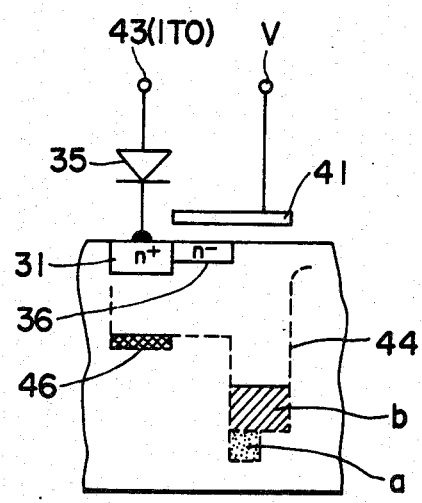

(III) At the time of $t_2$ (FIG. 6c):

FIG. 6c shows a state where the excess charges have been transferred to the CCD side as indicated by the arrow of FIG. 6b. The time required for the complete transfer is mainly determined by the conductance $g_m$ in the above-mentioned gate region g. Usually, the time is from a new ns to a new hundred ns. Namely, $t_2$ may be set at a time separated from $t_1$ by an interval on the above order of ns.

As apparent from FIG. 6c, the signal charges 46 left in the depletion layer region under the above-mentioned $N^+$-region (hereinafter called picture-element side) remain as the normal charges with a value below the afore-mentioned $Q_{CCD}$ charge quantity. Excess charges 45 transferred to the depletion layer on the CCD side consist of the charges corresponding to the $Q_{CCD}$ charge quantity shown by a dotted part a and the charges shown by oblique lines b which cause blooming. Namely, the sum of a and b corresponds to the excess charges 45. Since these excess charges are swept out of the imager during the vertical blanking period through a later-mentioned mechanism, blooming and highlight lag do not appear on a reproduced image display.

Figure 6D:
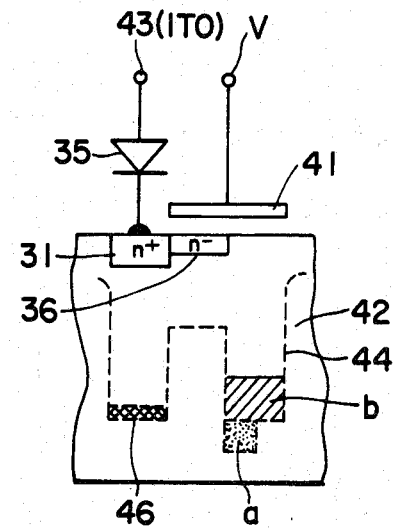
Figure 6E:
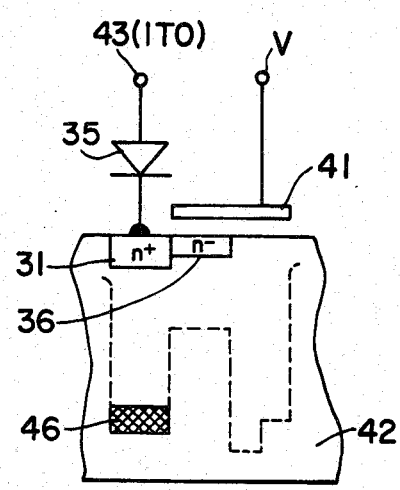

(IV) At the time of $t_3$ (FIG. 6d)

At this time, the ITO voltage $\phi_{ITO}$ is varied to a high potential $V_H$, e.g. 20 V. The bottom of the bucket of the picture-element side 31 becomes deep again. The normal electric charges 46 or the signal charges do not leak to the CCD side but are retained even if the transfer clock of the CCD is applied. Furthermore, by increasing the ITO voltage to the above value $V_H$, the bias voltage applied to the photoelectric conversion film 35 is reduced below about 5 V and the electric charge quantity generated in the photoelectric conversion film 35 during the period of high ITO voltage can be suppressed. Thus, the photoelectric conversion film 35 has such a function that the excess charge quantity does not go above a prescribed level during this period of high ITO voltage even if the light quantity is large.

After the time $t_3$, both of the above-mentioned excess charges a and b are transferred to the vertical line constituted by the CCD by means of the afore-mentioned high frequency transfer pulses $S_1$ and $S_2$ on the order of 1.8 MHz, and swept out of the imager through the horizontal transfer line. The frequency of these transfer pulses is not limited to this value, but may be chosen such that the excess charge can be transferred to the horizontal transfer stage during the vertical blanking period. It is needless to say that the exhaustion of the excess charge can be done not only by means of the horizontal transfer line but also by a sweep-out drain provided on the way of the vertical line.

(V) At the time of $t_4$ (FIG. 6e):

At this time, all the excess charges are exhausted out of the element. The charge quantity existing in the CCD region becomes zero. The normal signal charges 46 remain only on the side of the picture-element.

Figure 6F:
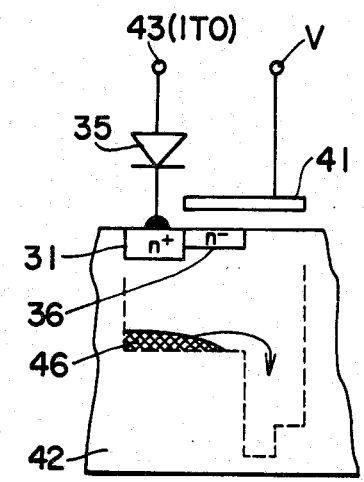

(VI) At the time of $t_5$ (FIG. 6f):

FIG. 6f shows a state in which the signal charge 46 is being read into the CCD side from the picture-element side as shown by the arrow at an instant when the picture-element read-in pulse $V_{CH}$ is applied to the clock terminal V. Here, $V_{CH}$ and $V_{1L}$ are selected to be 16 to 17 V and about 5 V, respectively.

Figure 6G:
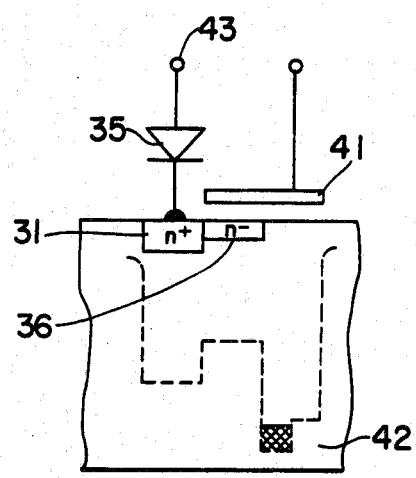

(VII) At the time of $t_6$ (FIG. 6g):

FIG. 6g shows a state in which after the lapse of a constant time (several tens ns to several hundreds ns as mentioned before) all the signal charges 46 are read from the picture-element side to the CCD side.

It is well known that in a subsequent period the signal charges or the normal charges transferred through the vertical line by the transfer pulses $V_1$ and $V_2$ (usually having a frequency of 15.75 kHz corresponding to one horizontal scanning period 1H of the television) and derived out of the element to form an image signal.

By using such a simple driving method, highlight lag and blooming are removed even in the presence of intense light. This ensures that an excellent image quality is obtained. In the example of an imager wherein a Newvicon film is overlaid on the above-mentioned CCD of interline type, the suppression factor of the highlight lag and the blooming (expressed by a multiple of saturation light quantity) by the conventional sweep-out method has been at most 10 to 20. According to this invention where $\phi_{ITO}$ is set to $V_L$ at $t_1$ and to $V_H$ at $t_3$, a suppression factor as large as 500 could be obtained even with a driving voltage kept within a range of breakdown voltage which is less than 20 V.

Figure 7:
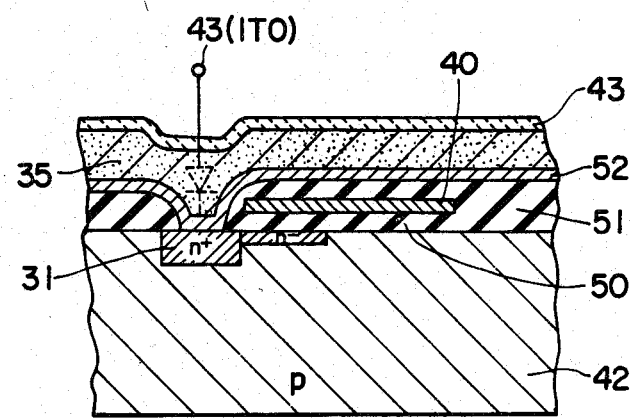
FIG. 7 is a cross-sectional view showing the main structure of the explained in connection with FIGS. 5 and 6 imager.

FIG. 7 shows an actual cross-sectional structure of a solid state imager that has been explained with reference to FIG. 5 and FIG. 6. Reference numeral 50 denotes a gate oxide film, 51 a thick $SiO_2$ film, 52 a metal electrode interposed between the region 31 and the photoelectric conversion film 35, and 43 a transparent electrode on the film 35.

Second Embodiment

Figure 8:
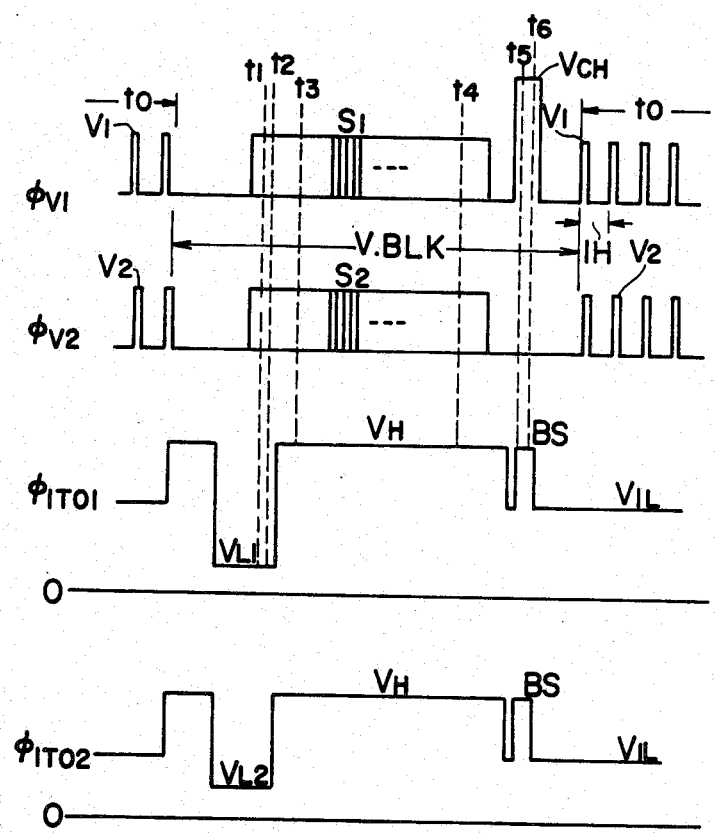
FIG. 8 shows operating waveforms of a solid state imager according to a second embodiment of the invention.

FIG. 8 shows a driving method according to the second embodiment of this invention. Although the CCD driving pulse of is entirely the same as that shown in FIG. 4, the pulse $\phi_{ITO}$ applied to the transparent electrode is different. $\phi_{ITO1}$ and $\phi_{ITO2}$ are pulses applied to the transparent electrode which characterizes the second embodiment. The former appears in the vertical blanking period of an odd field while the latter appears in the same period of an even field. The structure and the basic operation of the solid state imager of sensor type are nearly the same as those of the imager in the first embodiment. Here, only the part different from that of the first embodiment will be described. The most important state appears at the time $t_1$ in FIG. 8.

In this case, the potentials on the ITO sides are set at lower values $V_{L1}$ and $V_{L2}$. The level of the depletion layer just under the region 31 becomes shallow.

Figure 1:
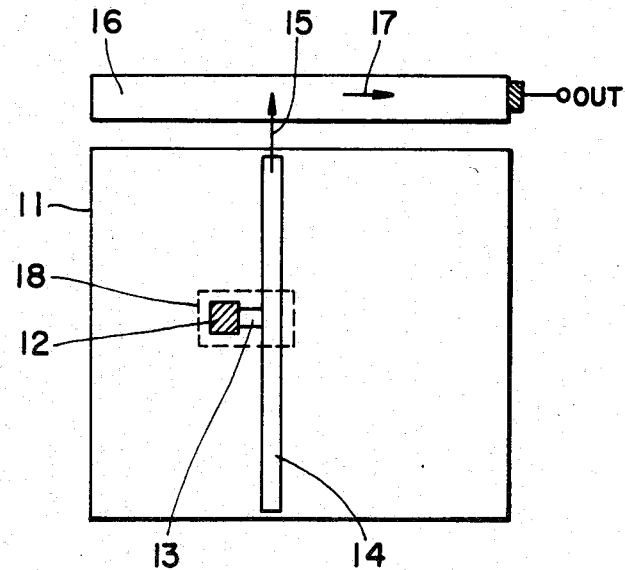
FIG. 1 is a schematic planar view of a prior art solid state imager.
Figure 2:
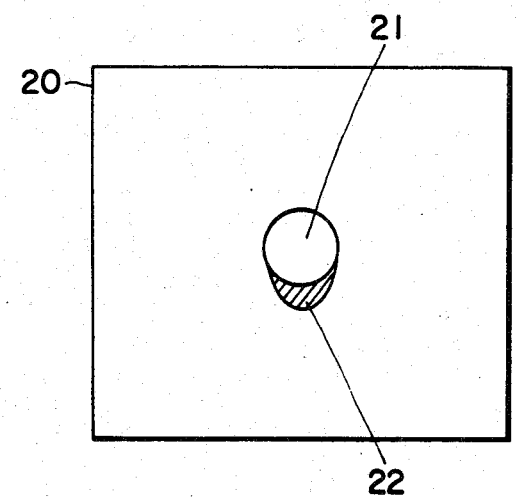
FIG. 2 is an explanatory diagram of the blooming phenomenon in a prior solid state imager.
Figure 3:
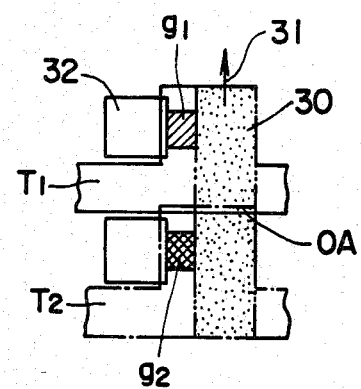
FIGS. 3 and 4 show, respectively a schematic planar diagram of the main part corresponding to one picture-element region of a solid state imager according to one embodiment of the invention, and the operating waveforms of such an imager.
Figure 9:
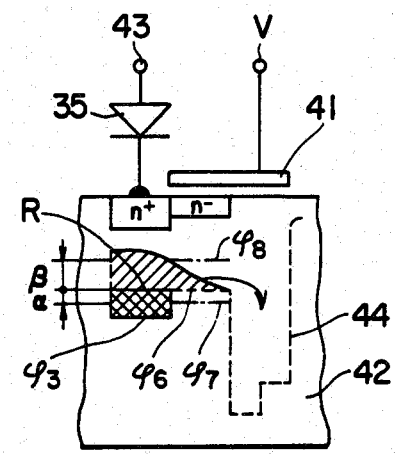
FIG. 9 is a constitution diagram showing the operation state at a time $t_1$ of the solid state imager of the second embodiment.

Now, we assume that the potential level $\psi_6$ is equal to $V_P$ of the gate $g_1$ in FIG. 3 (a read-in gate for odd fields), or a level corresponding to $V_{P1}$, and that the potential level $\psi_7$ corresponding to $V_P$ of the read-in gate for even fields, or $V_{P2}$, is larger than $\psi_6$. FIG. 9 shows such a state.

The reason why $V_P$ of the gates $g_1$ and $g_2$ are different has been described already with reference to FIG. 3. In this case, the sweep-out quantity of electric charges includes both the excess charge component and the normal charge component.

That is, the normal charge quantity corresponding to a potential height $\alpha$ (difference between the levels $\psi_6$ and $\psi_7$) in FIG. 9 is swept away.

This means a reduction of the saturation signal quantity of a picture-element or a reduction of dynamic range. Furthermore, the fact that the saturation signal quantity differs with fields becomes a cause of flicker.

On the other hand, if $V_{P1}$ is smaller than $V_{P2}$, the above-mentioned potential level $\psi_7$ decreases to a shallower level $\psi_8$ as shown in FIG. 9.

In such a case, the excess charge component is left on the picture-element side.

The remaining quantity depends on a difference $\beta$ between the potential levels $\psi_6$ and $\psi_8$. If the electric charge corresponding to $\beta$ is left on the picture-element side, highlight lag and blooming are induced.

The largest characteristic of the second embodiment of this invention is that the above-mentioned problems are obviated even if $V_P$ of the read-in gate for each field differs depending on the semiconductor processes.

Namely, the voltage applied to the transparent electrode ITO 43 during the vertical blanking period is varied at each field so that the difference in $V_P$ is equivalently absorbed.

Pulses $\phi_{ITO1}$ and $\phi_{ITO2}$ applied to the transparent electrode during the vertical blanking period as shown in FIG. 8 are also applied to read-in gates $g_1$ (at a time of reading out an odd field) and $g_2$ (at a time of reading out an even field). The values of $V_{L1}$ and $V_{L2}$ are made to be different so that the above-mentioned difference in $V_P$ may be absorbed.

Now, let us assume that the potential level corresponding to $V_{P1}$ is at $\psi_6$ while the potential level corresponding to $V_{P2}$ is at $\psi_7$, i.e. $V_{P2} > V_{P1}$. Then, the signal charge for reading out an odd field appears only with the normal charges, the excess charge component being swept out. At the time of reading out an even field, since the normal charge component can be also scraped off, the voltage $V_{L2}$ is made to become larger than $V_{L1}$ in order to deepen the bottom of the bucket on the picture-element side. Thus, the upper end R of the crosshatched part indicating the normal charges is set to a potential which is substantially equal to $\psi_7$. In this way, even at the time of reading out an even field, all the excess charge are swept out and only the normal charge component can be derived as the signal charge.

It is needless to say that, when $V_{P2} < V_{P1}$, $V_{L2}$ is set lower than $V_{L1}$. Then, the defect in the prior art that the excess charge is left can be removed.

Although the above explanation of the photoelectric conversion film has been made primarily on the heterojunction thin film, the invention is not limited to this but may be applied to $\alpha$-Si and Se, etc.

As described above, according to this invention wherein the applied voltage is kept within a range lower than the breakdown voltage of solid state imagers, the factor of suppressing the highlight lag and blooming is increased to 5000 and furthermore flicker is eliminated even in the presence of intense light.

We claim:

1. A solid state imager comprising:
   a scanning circuit including a semiconductor substrate, said scanning circuit having a signal storage period and being operated by application of vertical clock pulses including vertical transfer pulses separated by vertical blanking periods and with high frequency transfer pulses having a frequency higher than that of the vertical transfer pulses occuring for a predetermined period in the vertical blanking periods;
   a photoelectric conversion film formed on said scanning circuit for generating signal charges in response to incident light, said charges being stored in said substrate during the signal storage period;
   a transparent electrode formed on said photoelectric conversion film;
   means for applying a voltage to said transparent electrode in a period that said high frequency transfer pulses exist for setting said semiconductor substrate at a more shallow potential level relative to the potential level of said substrate during the signal storage period; and
   means for transferring excess photoelectric generated charges to outside of said imager during the vertical blanking period.

2. An imager according to claim 1, wherein said photoelectric conversion film comprises amporphous silicon containing hydrogen.

3. An imager according to claim 1, wherein said photoelectric conversion film comprises a semiconductor of II-VI group compounds.

4. An imager according to claim 1, wherein said scanning circuit comprises a charge carrier device operating with horizontal and vertical clock pulses.

5. An imager according to claim 1, wherein said means for applying a voltage includes first means for applying a voltage to said transparent electrode during a first interval for setting the potential level of said substrate to said more shallow potential level, and second means for applying a voltage to said transparent electrode during a second interval for deepening the substrate potential level relative to the potential level during the signal storage period, said first and second intervals being included in said predetermined period that said high frequency transfer pulses occur.

6. An imager according to claim 5, wherein said photoelectric conversion film comprises amorphous silicon containing hydrogen.

7. An imager according to claim 5, wherein said photoelectric conversion film comprises a semiconductor of II-VI group compounds.

8. An imager according to claim 5, wherein said scanning circuit comprises a charger carrier device operating with horizontal and vertical clock pulses.

9. A solid state imager comprising:
   a scanning circuit including a semiconductor substrate, said scanning circuit having a signal storage period and being operated by application of vertical clock pulses including vertical transfer pulses separated by vertical blanking periods and with high frequency transfer pulses having a frequency higher than that of the vertical transfer pulses occuring for a predetermined period in the vertical blanking periods;
   a photoelectric conversion film formed on said scanning circuit for generating signal charges in response to incident light, said charges being stored in said substrate during the signal storage period;
   a transparent electrode formed on said photoelectric conversion film;
   means for applying a voltage to said transparent electrode in a period that said high frequency transfer pulses exist for setting said semiconductor substrate at a more shallow potential level relative to the potential level of said substrate during the signal storage period, said voltage being applied to said transparent electrode with two different voltage magnitudes during each field period; and
   means for transferring excess photoelectric generated charges to outside of said imager.

10. An imager according to claim 9, wherein said means for applying a voltage includes first means for applying a voltage to said transparent electrode during a first interval for setting the potential level of said substrate to said more shallow potential level, and second means for applying a voltage to said transparent electrode during a second interval for deepening the substrate potential level relative to the potential level during the signal storage period, said first and second intervals being included in said predetermined period that said high frequency transfer pulses occur.

11. An imager according to claim 9, wherein said photoelectric conversion film comprises amorphous silicon containing hydrogen.

12. An imager according to claim 9, wherein said photoelectric conversion film comprises a semiconductor of II-VI group compounds.

13. An imager according to claim 9, wherein said scanning circuit comprises a charge carrier device operating with horizontal and vertical clock pulses.

14. An imager according to claim 10, wherein said scanning circuit comprises a charge carrier device operating with horizontal and vertical clock pulses.

* * * * *